(12) United States Patent
Mahadevan et al.

(10) Patent No.: US 6,333,583 B1
(45) Date of Patent: Dec. 25, 2001

(54) MICROELECTROMECHANICAL SYSTEMS INCLUDING THERMALLY ACTUATED BEAMS ON HEATERS THAT MOVE WITH THE THERMALLY ACTUATED BEAMS

(75) Inventors: Ramaswamy Mahadevan; Edward A. Hill, both of Chapel Hill; Robert L. Wood, Cary; Allen Cowen, Morrisville, all of NC (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 09/537,588

(22) Filed: Mar. 28, 2000

(51) Int. Cl.$^7$ ................................................. H01N 10/00
(52) U.S. Cl. ........................ 310/306; 60/527; 337/141; 361/164
(58) Field of Search ................................... 310/306, 307; 361/164; 60/516, 527; 337/141

(56) References Cited

U.S. PATENT DOCUMENTS

| | | | |
|---|---|---|---|
| 4,864,824 | * 9/1989 | Gabriel et al. | 60/527 |
| 5,335,498 | * 8/1994 | Komatsu et al. | 60/528 |
| 5,619,177 | * 4/1997 | Johnson et al. | 337/140 |
| 5,909,078 | 6/1999 | Wood et al. | 310/307 |
| 5,994,816 | 11/1999 | Dhuler et al. | 310/307 |

FOREIGN PATENT DOCUMENTS

| | | | |
|---|---|---|---|
| 61-190177 | * 8/1986 | (JP) | H02N/10/00 |
| 61-199477 | * 9/1986 | (JP) | H02N/10/00 |
| 5-284765 | * 10/1993 | (JP) | H02N/10/00 |

OTHER PUBLICATIONS

U.S. Patent Application Entitled: Multi–Dimensional Scalable Displacement Enabled Microelectromechanical Actuator Structures and Arrays; Filed May 3, 1999.

* cited by examiner

Primary Examiner—Burton S. Mullins
(74) Attorney, Agent, or Firm—Myers Bigel Sibley & Sajovec

(57) ABSTRACT

Improved microelectromechanical structures include spaced-apart supports on a microelectronic substrate and a beam that extends between the spaced-apart supports and that expands upon application of heat thereto to thereby cause displacement of the beam between the spaced-apart supports. A heater, located on the beam, applies heat to the beam and displaces with the beam as the beam displaces. Therefore, heat can be directly applied to the arched beam, thereby reducing thermal loss between the heater and the arched beam. Furthermore, an air gap between the heater and arched beam may not need to be heated, thereby allowing improved transient thermal response. Moreover, displacing the heater as the arched beam displaces may further reduce thermal loss and transient thermal response by reducing the separation between the heater and the arched beam as the arched beam displaces.

17 Claims, 8 Drawing Sheets

MICROELECTROMECHANICAL SYSTEMS INCLUDING THERMALLY ACTUATED BEAMS ON HEATERS THAT MOVE WITH THE THERMALLY ACTUATED BEAMS

FIELD OF THE INVENTION

This invention relates to electromechanical systems, and more particularly to microelectromechanical systems.

BACKGROUND OF THE INVENTION

MicroElectroMechanical Systems (MEMS) have been developed as alternatives to conventional electromechanical devices, such as relays, actuators, valves and sensors. MEMS devices are potentially low-cost devices, due to the use of microelectronic fabrication techniques. New functionality also may be provided, because MEMS devices can be much smaller than conventional electromechanical devices.

A major breakthrough in MEMS devices is described in U.S. Pat. No. 5,909,078 entitled Thermal Arched Beam Microelectromechanical Actuators to Wood et al. (Wood), the disclosure of which is hereby incorporated herein by reference. Wood discloses a family of thermal arched beam microelectromechanical actuators that include an arched beam which extends between spaced-apart supports on a microelectronic substrate. The arched beam expands upon application of heat thereto. For example, as described in Wood, a current is passed through the arched beams to cause thermal expansion thereof. Alternatively, as described in Wood, the thermal arched beams are heated by an external heater across an air gap.

When used as a microelectromechanical actuator, thermal expansion of the arched beam can create relatively large displacement and relatively large forces while consuming reasonable power. Thermal arched beams can be used to provide actuators, relays, sensors, microvalves and other MEMS devices. Other thermal arched beam microelectromechanical devices and associated fabrication methods are described, for example, in U.S. Pat. No. 5,994,816 to Dhuler et al. entitled Thermal Arched Beam Microelectromechanical Devices and Associated Fabrication Methods, the disclosure of which is hereby incorporated herein by reference. Notwithstanding the above, there continues to be a need to further improve MEMS devices.

SUMMARY OF THE INVENTION

The present invention can provide thermally actuated microelectromechanical structures including thermally actuated arched beams on heaters, wherein the arched beams remain on heaters as the arched beams displace. Accordingly, the present invention may provide improved transient thermal response and improved thermal efficiency. In particular, the arched beam on the heater moves therewith as the arched beam displaces. Therefore, heat can be directly applied to the arched beam, thereby allowing a reduction in thermal loss due to an air gap between the heater and the arched beam.

In contrast, conventional systems may include an air gap between a heater and a beam. Unfortunately the air gap can increase the thermal resistance and hence reduce heat flux. The air gap can also deteriorate the transient thermal response of the system.

According to the present invention an air gap between the heater and arched beam may not need to be heated with the arched beam, thereby allowing improved transient thermal response. Displacing the heater as the arched beam displaces may further reduce thermal loss and transient thermal response by reducing the separation between the heater and the arched beam as the arched beam displaces.

In particular, microelectromechanical structures according to the present invention can include spaced-apart supports on a microelectronic substrate and a beam, preferably an arched beam, that extends between the spaced-apart supports and that expands upon application of heat thereto to thereby cause displacement of the beam. The beam is on a heater that applies heat to the beam and displaces with the beam as the beam displaces.

In one embodiment of the present invention, a second beam extends between spaced-apart supports. The first and second beams are attached to a coupler on the heater, wherein the heater displaces with the coupler. The coupler may mechanically strengthen the coupling between the first and second beams. In another embodiment, the first and second beams are separate from the coupler and are located thereon.

In another embodiment according to the present invention, a scalable microelectromechanical structure can include moveable spaced-apart supports on a microelectronic substrate and a cross-beam that extends between the moveable spaced-apart supports. A first arched beam is arched in a first predetermined direction and expands in the first predetermined direction upon application of heat thereto to thereby cause displacement of the first arched beam relative to the moveable spaced-apart supports. A first arched beam is on a first heater that applies heat thereto and displaces with the first arched beam as the first arched beam displaces. A second arched beam is arched in a second predetermined direction and expands in the second predetermined direction upon application of heat thereto to thereby cause displacement of the second arched beam relative to the moveable spaced-apart supports. The second arched beam is on a second heater that applies heat thereto and displaces with the second beam as the second beam displaces.

In another embodiment according to the present invention, the spaced-apart supports are on heaters, wherein the heaters can move with the moveable spaced-apart supports.

DETAILED DESCRIPTION OF THE INVENTION

Figure 1A:
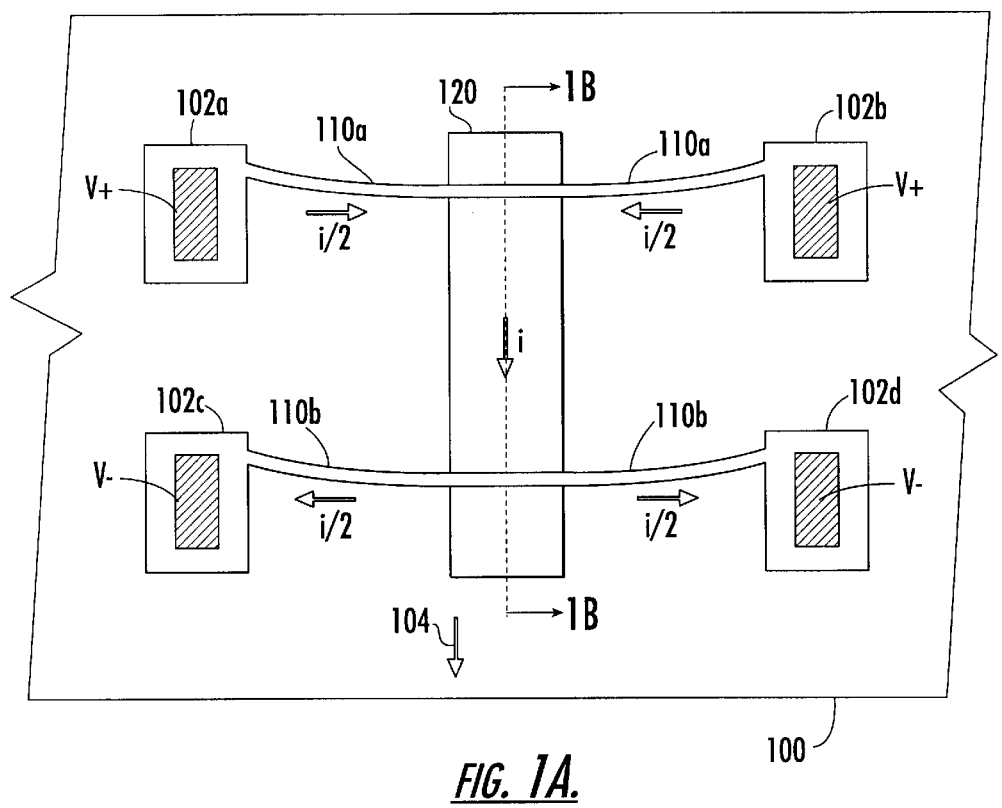
FIG. 1A is a plan view of a first embodiment of a thermal arched beam microelectromechanical actuator according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" another element, it can be directly on the other element or intervening elements may also be present. In contrast, when an element is referred to as being "directly on" another element, there are no intervening elements present.

FIG. 1A is an enlarged plan view of first embodiments of a thermal arched beam microelectromechanical actuator according to the present invention. As shown in FIG. 1A, a microelectromechanical actuator according to the present invention includes first-fourth spaced-apart supports 102a–d attached to a microelectronic substrate 100. A first arched beam 110a extends between the first and second spaced-apart supports 102a–b and a second arched beam 110b extends between the third and fourth spaced-apart supports 102c–d. The first and second arched beams 110a–b are arched in a predetermined direction 104 which preferably extends parallel to the microelectronic substrate 100. The arched beams 110 can also be arched in a non-parallel direction relative to the plane of the microelectronic substrate 100. For example, the arched beams 110 can be arched in a direction orthogonal to the plane of the microelectronic substrate 100.

Although FIG. 1A shows each arched beam 110a–b connected between a pair of respective spaced-apart supports 102a–d, the arched beams 110a–d can be connected between the single pair of spaced-apart supports 102a–b. The microelectronic substrate can be any suitable material, such as glass, silicon, other semiconductors, or other materials.

In the absence of thermal actuation, the arched beams are arched in a predetermined direction 104. In addition, the arched beam is adapted to arch further in the predetermined direction in response to heating. The arched beam 110 is on a heater 120 that heats the arched beam 110. Alternatively, the heater 120 can be on the arched beam 110. When the arched beam 110 is heated and arches further, the arched beam is displaced. In other words, arched beam 110 displaces further in the predetermined direction in response to heating. Once thermal actuation is removed, the arched beam displaces opposite to the predetermined direction 104 to return to the initial non-actuated arched position.

As used herein, the term displacement includes a change in position of a medial portion of the arched beam 110. For example, when the arched beam 110 is heated the medial portion of the arched beam 110 changes position relative to the end portions of the arched beam 110. Displacement can also include a change in the location of the end portions of the arched beam 110. For example, when the arched beam 110 is heated the end portions of the arched beam displace as the medial portions of the arched beams 110 also displace.

Figure 1B:
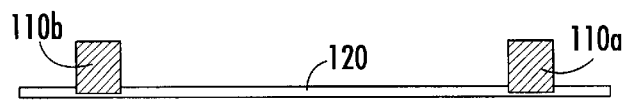
FIG. 1B is an enlarged cross-sectional view taken along line 1B–1B' in FIG. 1A.

FIG. 1B is an enlarged cross-sectional view taken along line 1B–1B' in FIG. 1A. According to FIG. 1B the first and second arched beam 110a–b are on the heater 120. The heater 120 heats the first and second arched beams 110a–b in response to a current, i, conducted by the arched beams. The current can be provided by applying a voltage to respective electrical contacts located on the first-fourth spaced-apart supports 102a–d. The current can also be conducted by fewer than all the arched beams. For example in one embodiment the current is conducted by two of the arched beams while the remaining arched beams can be used to conduct other signals. Alternatively, the current can be provided to the heater 120 by means other means such as flexible tethers described herein.

The current may be provided by applying voltage levels V+ and V− to electrical contacts on the spaced-apart supports 102a–d. In particular, the voltage levels V+ and V− can be applied to 102a and 102c, 102a and 102d, 102b and 102c, or 102b and 102d. The current is conducted by the heater 120, wherein the resistance of the heater 120 to the current causes the heater 120 to generate heat. The resistance of the heater 120 can be controlled by forming the heater from a material that provides resistivity to current flow therethrough, such as polysilicon. The resistance of the heater 120 can also be controlled by shaping the heater to promote resistance to the current flow such as by forming a portion of the heater to have a narrow shape.

The heat applied to the first and second arched beams 110a–b by the heater 120 causes further arching as a result of thermal expansion thereof. The arching preferably occurs along the predetermined direction 104 and thereby provides displacement of the first and second arched beams 110a–b. Moreover, the heater 120 moves with the first and second arched beams 110a–b as the arched beams displace in response to the heat applied by the heater 120. The first and second arched beams 110a–b can be directly on the heater 120 or other intervening elements, such as a coupler described herein, can be present.

The present invention may provide improved transient thermal response and improved thermal efficiency. In particular, the heater is on the arched beam and moves therewith as the arched beam displaces. Accordingly, heat can be applied directly to the arched beam, thereby reducing thermal loss due to a gap between the heater and the arched beam. Moreover, displacing the heater as the arched beam displaces may further reduce thermal loss by reducing the separation between the heater and the arched beam as the arched beam displaces.

In contrast, conventional microelectromechanical systems, such as those described in Wood, may use heaters located on the microelectronic substrate. Accordingly, conventional systems may include an air gap between the heater on the microelectronic substrate and the arched beam heated by the heater. Consequently, conventional systems may experience thermal loss due to the air gap. Furthermore, conventional systems may suffer from reduced transient thermal response because the heater on the microelectronic substrate heats the air gap as well as the arched beam thereby possibly increasing in the time needed to heat the arched beam. The air gap can increase the thermal resistance and thereby reduce heat flux. The air gap can also deteriorate the transient thermal response of the system.

It will be understood by those having skill in the art that arched beams 110 may be fabricated using high aspect ratio electroplating techniques, which are commonly referred to as "LIGA" techniques, or other microelectronic techniques. The arched beams 110 may be freed from the microelectronic substrate using release layers and wet etching or other conventional techniques. As shown, the arched beam 110 is anchored at supports 102a and 102b such that it is arched toward the desired direction of motion 104.

The arched beams are preferably formed of a material which changes shape, such as by expanding, in response to heating. While an arched beam can be created from material that has a negative thermal coefficient of expansion that contracts as temperature increases, preferably arched beams are constructed from materials having a large positive thermal coefficient of expansion, such as nickel. Thus, an arched beam is preferably formed from a material that expands as the temperature increases, such that the arched beam arches further when heated. The thermal arched beams and/or other components of the thermal arched beam actuator, such as the anchors, can be formed from a single crystal material such as silicon. Arched beams and anchors can be formed of a single crystal material, such as silicon, using established micro engineering techniques, such as surface micromachining. It will be understood that the thermal arched beam, anchors, and other components of the thermal arched beam actuator may be formed from different materials.

Thermal arched beam microelectromechanical actuators according to the present invention may produce a large amount of deflection for a given amount of thermal expansion. For example, a nickel beam which is 1 mm in length and which is heated by 20° C. may expand by about 0.25 $\mu$m in length. This may be ten times less than the displacement needed for some microelectromechanical actuator applications. In contrast, when the same beam is configured as a thermal arched beam, the same heating can cause 2.5 $\mu$m of displacement. Such deflection can be confined to the plane of the device by using high aspect ratio fabrication techniques such as LIGA.

Figure 1C:
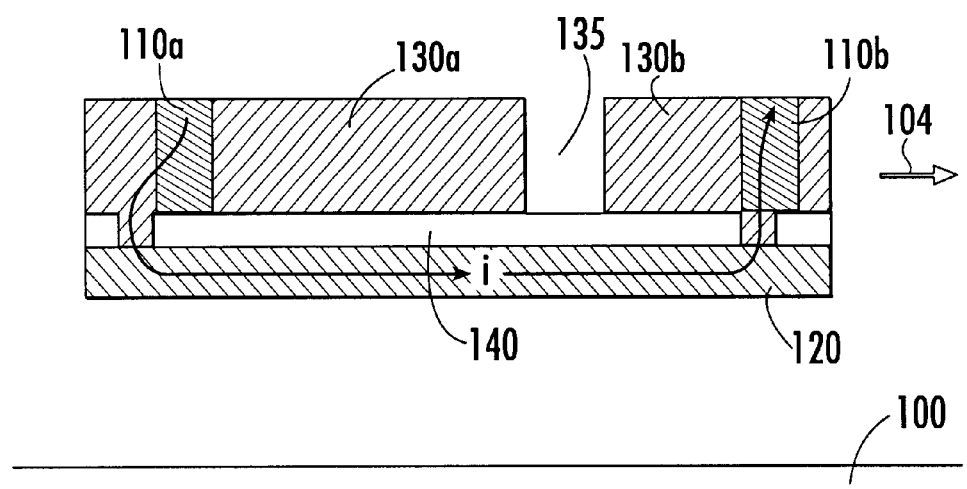
FIG. 1C is an enlarged cross-sectional view of a second embodiment of a thermal arched beam microelectromechanical actuator according to the present invention.

FIG. 1C is an enlarged cross-sectional view of a second embodiment of a thermal arched beam microelectromechanical actuator according to the present invention. According to FIG. 1C, a first insulator layer 140 is formed on the heater 120. Contact holes are formed in the first insulator layer 140 to provide electrical contact to the heater 120. The first insulator layer 140 can be made, for example, of silicon nitride. A second insulator layer (not shown) can be formed on the heater 120 opposite the first insulating layer 140.

First and second coupler portions 130a–b can be formed on the first insulator layer 140 and in the contact holes therein to form respective first and second electrical contacts to the heater 120. The first arched beam 110a can be attached to the first coupler portion 130a and the second arched beam 110b can be attached to the second coupler portion 130b. In a preferred embodiment according to the present invention, the first and second beams 110a,b and the first and second coupler portions 130a–b can be part of the same layer. For example, according to FIG. 1C, the first arched beam 110a and the first coupler portion 130a can be a single component. The second arched beam 110b and the second coupler portion 130b can also be a single component. Alternatively, the arched beams 110a–b can be separate from the coupler portions 130a–b.

The first coupler portion 130a is separated from the second coupler portion 130b by a gap 135. In one embodiment, the gap 135 can eliminate any direct current flow between the first and second coupler portions 130a–b (except through the heater 120).

The coupler may mechanically strengthen the coupling between the first and second arched beams. The gap 135 electrically isolates the first coupler portion 130a from the second coupler portion 130b so that current supplied via the arched beams is conducted through the heater 120. It will be understood that although the embodiments shown in FIG. 1C depict a gap between the first and second coupler portions, a coupler without a gap may be used wherein the first and second coupler portions are electrically isolated from each other, for example, by an intervening insulating layer in the gap 135.

In operation, current can flow from the first arched beam 110a, through the first coupler portion 130a to the heater 120 via the first contact. The current is conducted by the heater 120 portion to the second coupler 130b via the second contact to the second arched beam 110b. The heat dissipated by the heater 120 causes the heater 120 to heat the first and second coupler portions 130a,b and the first and second arched beams 110a–b. When heat is applied to the arched beams the arched beams further arch which results in displacement of the first and second coupler portions 130a–b in the predetermined direction. Moreover, the heater 120 moves with the arched beams as they displace in response to the heat applied by the heater 120.

Figure 2:
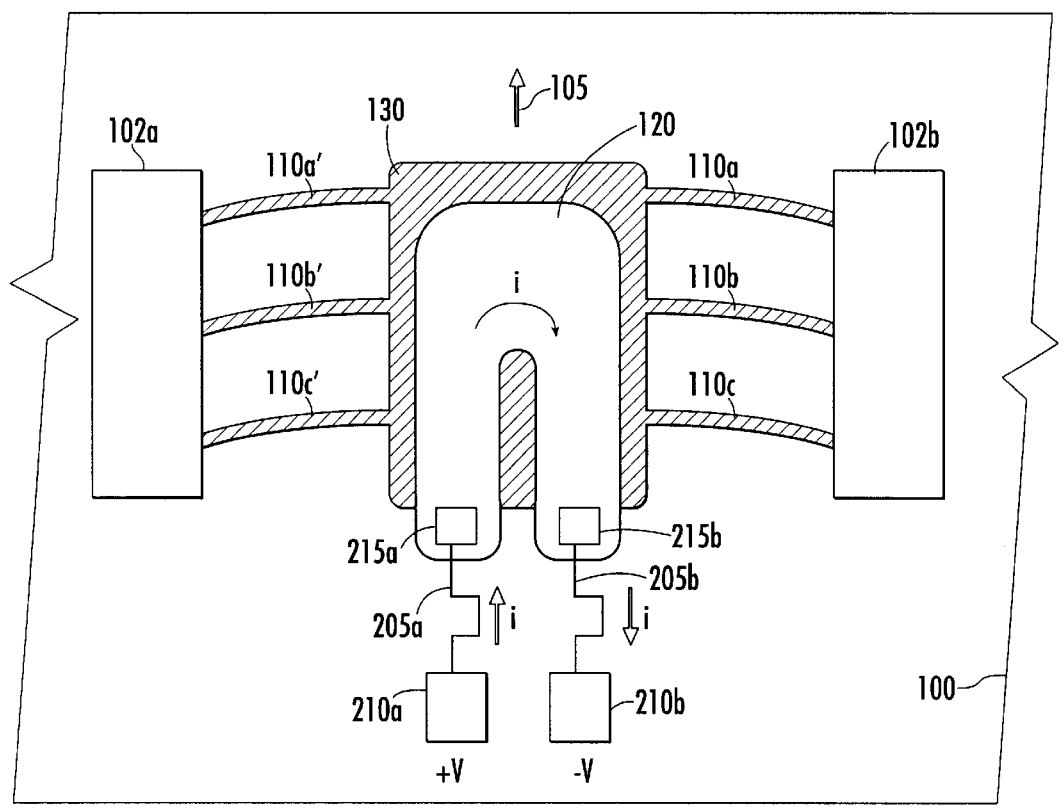
FIG. 2 is a first view of a heater side of a third embodiment of a thermal arched beam microelectromechanical actuator according to the present invention.

FIG. 2 is a view of a heater side of a third embodiment according to the present invention. As shown in FIG. 2, a U shaped heater 120 has a coupler 130 disposed thereon that couples the first-third arched beams 110a–c, 110a'–c' together. The heater 120 includes first and second electrical contacts 215a–b. Current is provided to the heater 120 via first and second electrical contacts 215a–b which causes the heater 120 to generate heat that is applied to the first-third arched beams 110a–c, 110a'–c' via the coupler 130. The heating of the first-third arched beams 110a–c, 110a'–c' causes the first-third arched beams 110a–c to displace in a predetermined direction 105. The heater 120 moves with the arched beams 110a–c, 110a'–c' as they displace in response to the heat applied by the heater 120. More or fewer arched beams may be used. The arched beams 110a–c, 110a'–c' and the coupler 130 can be separate units or one combined unit as described above in reference to FIG. 1C.

By configuring multiple arched beams, force multiplication can be obtained, so that large forces, and large displacement actuators may be provided. Moreover, the coupler 130 may provide a stiffening effect on the entire actuator. Accordingly, relatively large forces may be provided by coupled arched beams.

The heater 120 can be configured in other shapes. For example, the heater 120 may be shaped as a sheet on the coupler 130, as a sheet having a narrow shape at a portion therein where heat is desired, or the heater 120 may be a meandering shape to distribute heat to desired portions thereof. Other shapes also may be used.

The current is provided to and from the heater 120 via first and second electrodes 210a–b on the microelectronic substrate 100 over respective first and second flexible tethers (or flexible conductors) 205a–b electrically coupled to the electrical contacts 215a–b on the heater 120. In operation, a voltage can be applied across the first and second electrical contacts 210a–b to provide current flow through the heater 120. The flexible tethers 205a–b maintain an electrical connection between the first and second electrical contacts 215a–b and the first and second electrodes 210a–b as the arched beams 110a–c, 110a'–c' and the coupler 130 displace in the predetermined direction 105.

Figure 3:
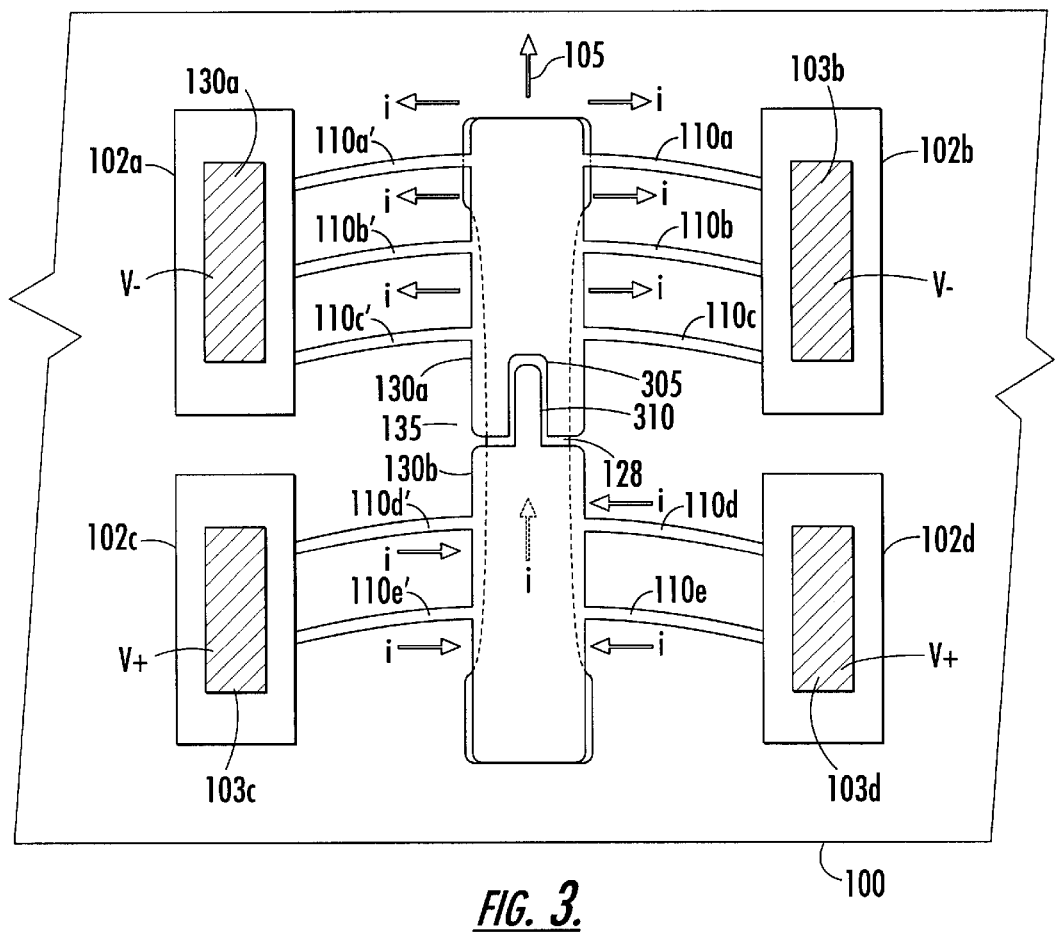
FIG. 3 is an enlarged plan view of a fourth embodiment of a thermal arched beam microelectromechanical actuator according to the present invention.

FIG. 3 is an enlarged plan view of a fourth embodiment according to the present invention. As shown in FIG. 3, first-third arched beams 110a–c, 110a'–c' extend between and are connected to the first and second spaced-apart supports 102a–b. Alternatively, the first-third arched beams 110a–c, 110a'–c' can each be connected to a separate spaced-apart support 102. The first and second spaced-apart supports 102a–b include a first pair of electrodes 103a,b. More of fewer arched beams can be used.

Fourth and fifth arched beams 110d–e, 110d'–e' extend between and are connected to third and fourth spaced-apart supports 102c–d. The fourth and fifth arched beams 110d–e, 110d'–e' can be connected to a common support, as shown, or each can be connected to a separate spaced-apart support 102. The third and fourth spaced-apart supports 102c–d include a second pair of electrodes 130c,d. More of fewer arched beams can be used.

A first coupler portion 130a is on the first-third arched beams 110a–c, 110a'–c' and includes a recess 305 therein. A second coupler portion 130b is on the fourth and fifth arched beams 110d–e, 110d'–e' and includes an extension 310 therefrom. The extension 310 is inserted into the recess 305 in a non-contacting relationship. The insertion of the extension 310 into the recess 305 can provide improved stiffening between the first-fifth arched beams 110a–e, 110a'–e'.

The gap 135 electrically isolates the first coupler portion 130a from the second coupler portion 130b so that current supplied via the arched beams is conducted through the heater 120. It will be understood that although the embodiments shown in FIG. 3 depict a gap between the first and second coupler portions, a coupler without a gap may be used wherein the first and second coupler portions are electrically isolated from each other, for example, by an intervening insulating layer in the gap 135.

In operation, a voltage can be applied across the first and second pairs of electrodes thereby causing the arched beams 110 to conduct current to and from the heater 120. For example, a first voltage level V+ can be applied to the third and fourth spaced-apart supports 102c–d and a second voltage level V− can be applied to the first and second spaced-apart supports 102a–b. The resulting current, i, is conducted to and from the heater 120 via the fourth and fifth arched beams 110d–e and the first-third arched beams 110a–c respectively. Alternatively, the arched beams can be on the first and second coupler portions 130a–b and the current can be provided to and from the heater 120 with the first and second coupler portion 130a–b.

The current conducted by the heater 120 causes the heater 120 to heat the first-fifth arched beams 110a–e, 110a'–e' which displace in the predetermined direction 105. Moreover, the heater 120 moves with the arched beams as they displace in response to the heat applied by the heater 120. As shown in FIG. 3, the current can be provided to and from the heater 120 by the arched beams and the first and second coupler portions 130a–b. Alternatively, the current can be provided to the heater 120 by fewer than all of the arched beams 110 or via flexible tethers.

Figure 4A:
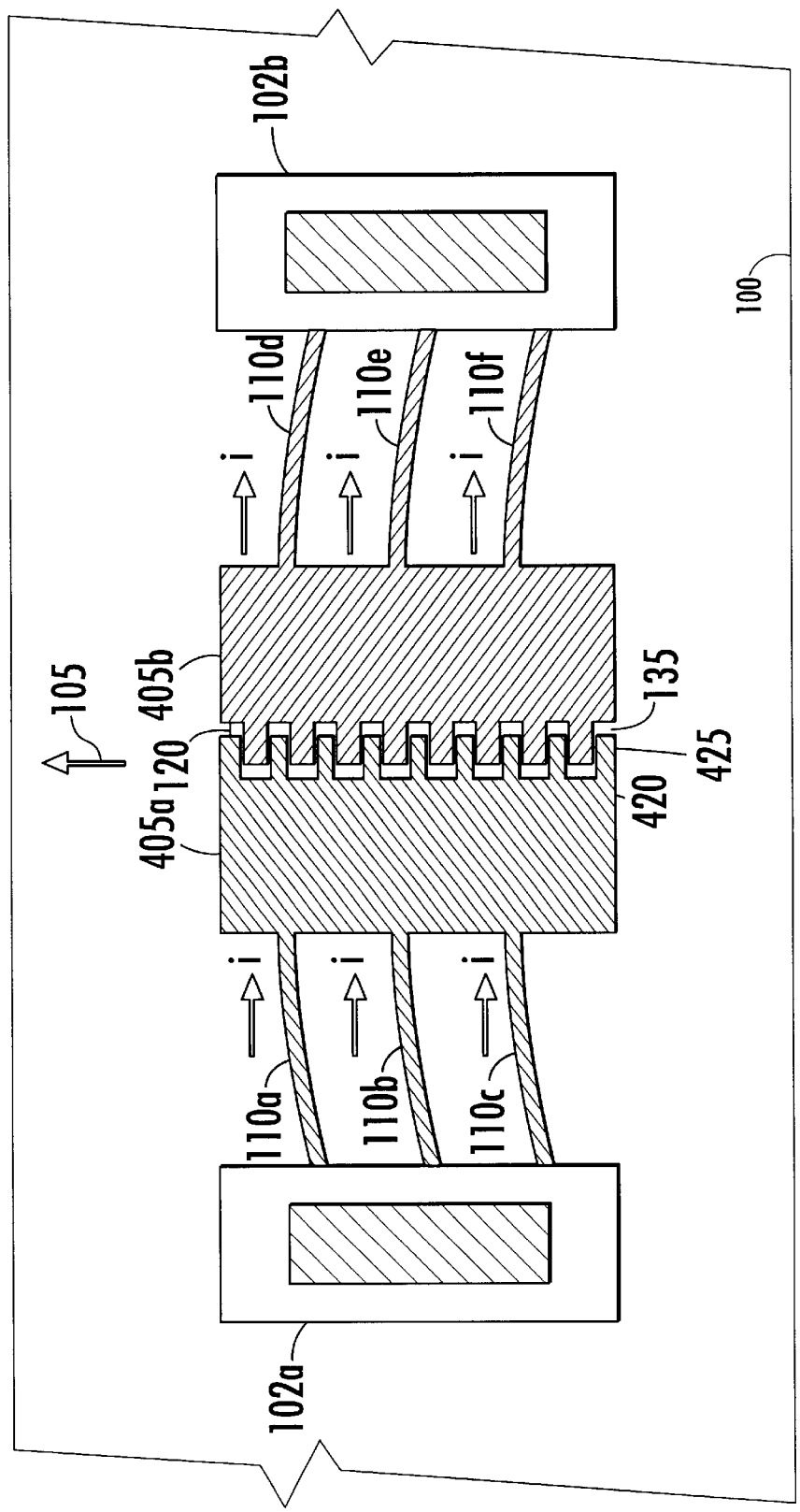
FIG. 4A is an enlarged plan view of a coupler side of a fifth embodiment of a thermal arched beam microelectromechanical actuator according to the present invention.

FIG. 4A is an enlarged view of a coupler side of a fifth embodiment according to the present invention. As shown in FIG. 4A, a first coupler portion 405a attached to first-third arched beams 110a–c, 110a'–c' includes a plurality of extensions 425 therefrom. A second coupler portion 405b attached to the first-third arched beams 110a–c includes a plurality of recesses 420 therein. The plurality of extensions 425 are inserted into the plurality of respective recesses 420 in a non-contacting relationship to define a gap 135 therebetween. The insertion of the plurality of extensions 425 into the plurality of respective recesses 420 can provide improved stiffening between the first-third arched beams 110a–c, 110a'–c'. The plurality of extensions 425 and recesses 420 can comprise other shapes, such as triangular, circular, or other shapes. In an alternative embodiment, each of the arched beams 110a–c can be joined to the respective arched beam 110a'–c' to provide separate arched beams on the coupler 405a,b. Furthermore, the arched beams and the respective couplers can be separate units or combined units as described in reference to FIG. 1C.

Figure 4B:
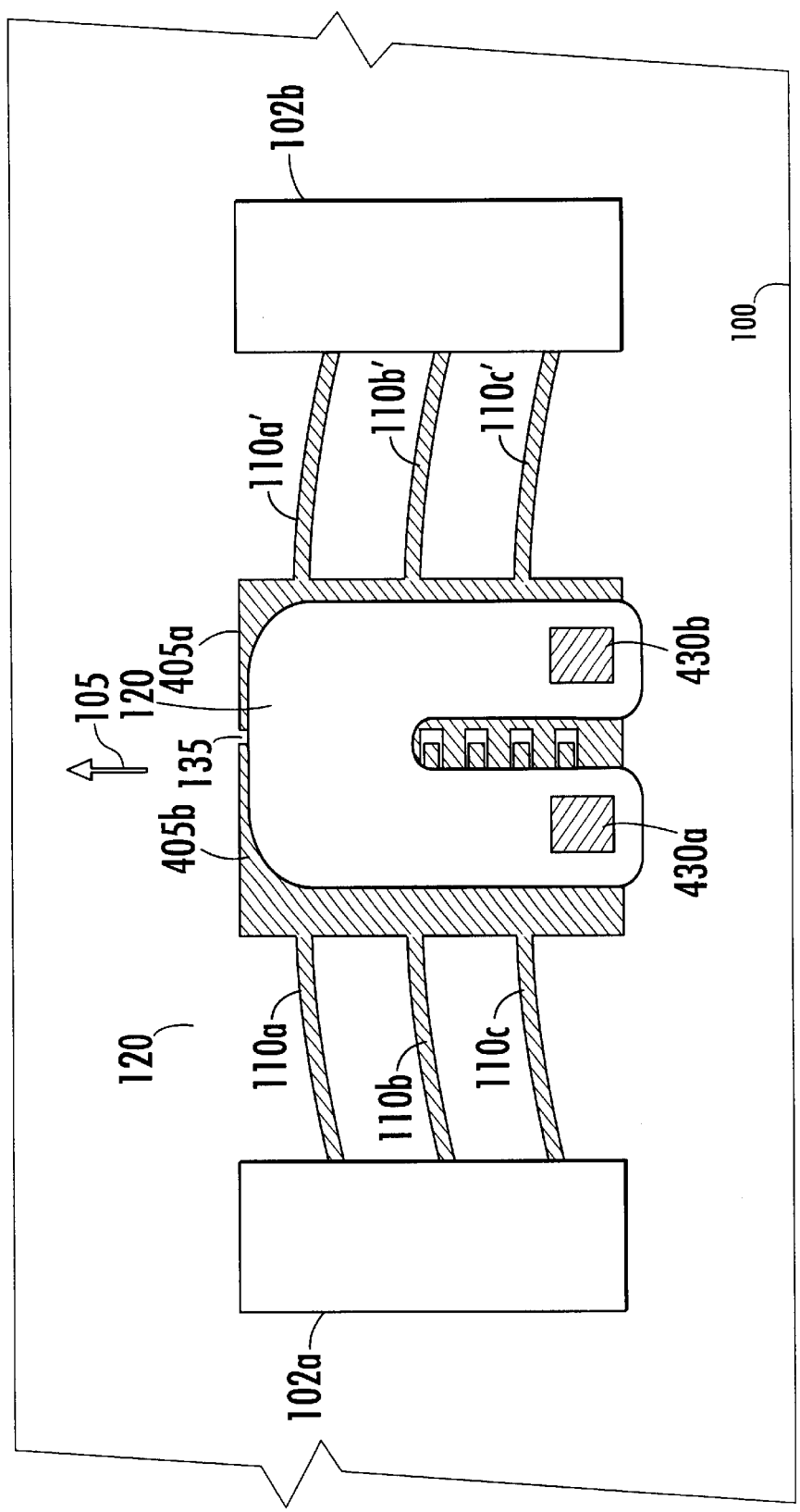
FIG. 4B is an enlarged plan view of a heater side of the embodiment shown in FIG. 4A.

FIG. 4B is an enlarged view of a heater side of the embodiment shown in FIG. 4A. According to FIG. 4B, the heater 120 is on the first and second coupler portions 405a–b. The heater 120 can be in a U-shaped configuration as discussed above in reference to FIG. 2 or configured in another shape. First and second electrical contacts 430a–b provide current to and from the heater 120. Passing current through the heater 120 causes the heater 120 to heat the first and second coupler portions 405a–b and the first-third arched beams 110a–c, 110a'–c' causing the arched beams to displace in the predetermined direction 105. The expansion of the arched beams causes the arched beams 110a–c, 110a'–c' to displace in the predetermined direction 105. The heater 120 moves with the arched beams as they displace in response to the heat applied by the heater 120.

In one embodiment according to the present invention, the first and second coupler portions 405a–b are insulated from heater 120. In operation, a voltage can be applied across the first and second electrical contacts 430a–b causing current to flow through the heater 120. Current flow through the heater 120 causes the arched beams 110a–c, 110a'–c' to be heated and displace in the predetermined direction 105. The heater 120 moves with the arched beams as they displace in response to the heat applied by the heater 120.

In another embodiment according to the present invention, the first and second coupler portions 405a–b are not insulated from heater 120. In operation, the current can be provided by applying a potential difference across the first and second spaced-apart supports 102a–b.

In another aspect, the present invention can provide thermally actuated microelectromechanical actuator structures and arrays that are scalable to provide a substantial amount of displacement in multiple dimensions. As used in the present invention, "scalable" refers to microelectromechanical actuator structures or cells that can be interconnected in an array so as to combine the displacement of each structure or cell therein in response to thermal actuation. For example, if a single unit cell provides a displacement distance of X in response to heating, an array of the cells coupled together can provide a displacement distance of 2X. All thermally actuated structure and array embodiments provided according to the present invention can be disposed on the microelectronic substrate 100, preferably on a generally planar surface thereof. The microelectronic substrate 100 can be any suitable material, such as glass, silicon, other semiconductors, or other materials.

Figure 5:
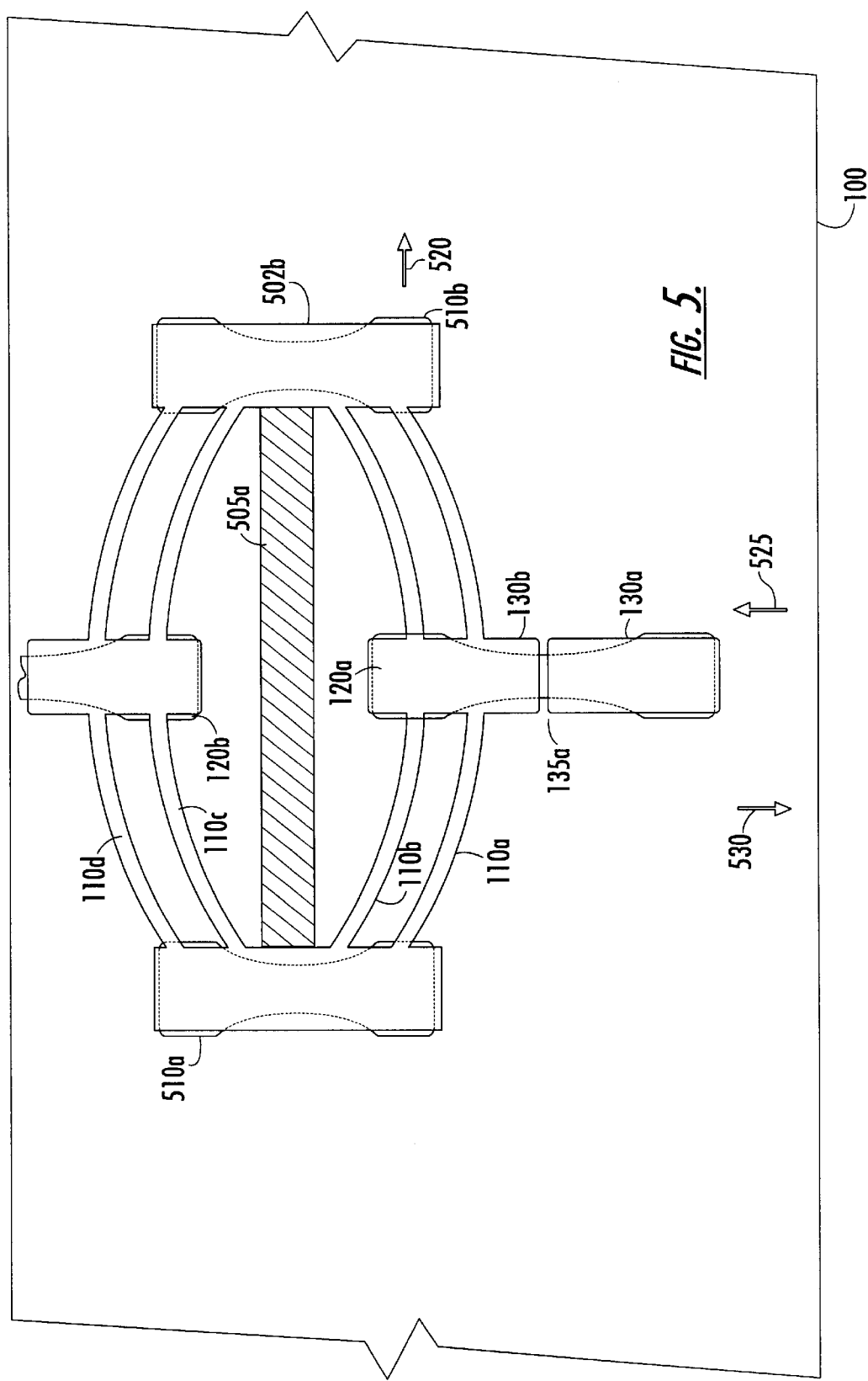
FIG. 5 is an enlarged plan view of a scalable unit cell according to the present invention.

FIG. 5 is an enlarged plan view of a scalable unit cell according to the present invention. According to FIG. 5, the first coupler portion 130a is anchored to the microelectronic substrate 100. The second coupler portion 130b is on and attached to the first and second arched beams 110a–b, 110a'–b'. The first and second arched beams are arched in a first predetermined direction 530.

The first and second arched beams 110a–b are connected to and extend between first and second spaced-apart moveable supports 502a–b. The first and second spaced-apart moveable supports 502a–b are not fixed to the microelectronic substrate 100 and may move in a second predetermined direction 525.

The first and second coupler portions 130a–b are on a first heater 120a and remain thereon as the first and second arched beams 110a–b further arch in response to heating by the first heater 120a. When the first and second arched beams 110a–b arch in the first predetermined direction 530, the first and second spaced-apart moveable supports 502a–b displace in the second predetermined direction 525. In particular, the first and second spaced-apart moveable supports 502a–b are displaced in the second predetermined direction 525 because the first coupler portion 130a is anchored to the microelectronic substrate 100 and the first and second spaced-apart moveable supports 502a–b are not anchored to the microelectronic substrate 100.

In one embodiment according to the present invention, the moveable spaced-apart supports 502a–b can be on respective heaters 510a–b. The heaters 510a–b can provide additional heating to the arched beams 110.

A cross-beam 505a is connected to and extends between the first and second spaced-apart moveable supports 502a–b. The cross-beam 505a can reduce the movement of the first and second spaced-apart moveable supports 502a–b in a third predetermined direction 520 as the arched beams displace. In particular, the crossbeam 505a can be a material having a coefficient of thermal expansion that is less than the coefficient of thermal expansion associated with the arched beams.

The cross-beam 505 provides additional mechanical stability and moveable support for the interconnected pairs of arched beams 110. The crossbeams 502 can be adapted to expand less than the arched beams 110. The crossbeams are preferably adapted to be heated less than the corresponding pair of thermal arched beams within each thermally actuated microelectromechanical structure, in order to conserve energy and limit the expansion of the crossbeams. As such, the crossbeams can limit the outward movement of the opposed ends of the arched beams in the predetermined direction 520 such that the further arching of the arched beams results in significant displacement of the medial portions of the arched beams.

Third and fourth arched beams 110c–d are connected to and extend between the first and second spaced-apart moveable supports 502a–b. The third and fourth arched beams 110c–d are arched in the second predetermined direction 525. A third coupler portion 130c is on and is connected to the third and fourth arched beams 110c–d. A second heater 120b is on the third coupler portion 130c and moves with the third and fourth arched beams 110c–d as they displace in response to heating by the second heater 120b. When the third and fourth arched beams 110c–d further arch, the third and fourth arched beams 110c–d are displaced in the second predetermined direction 525.

In operation, a current can be passed through the heaters 120 to heat the respective attached arched beams, thereby causing the arched beams 110 to displace in the respective predetermined directions. In particular, when the first and second arched beams 110a–b are heated, the first and second spaced-apart moveable supports 502a–b are displaced in the first predetermined direction 525. When the third and fourth arched beams 110c–d are heated, the third coupler portion 130c is displaced in the second predetermined direction 525. According to FIG. 5, the respective displacements of the first-fourth arched beams 110a–d can be added to provide increased displacement.

Figure 6:
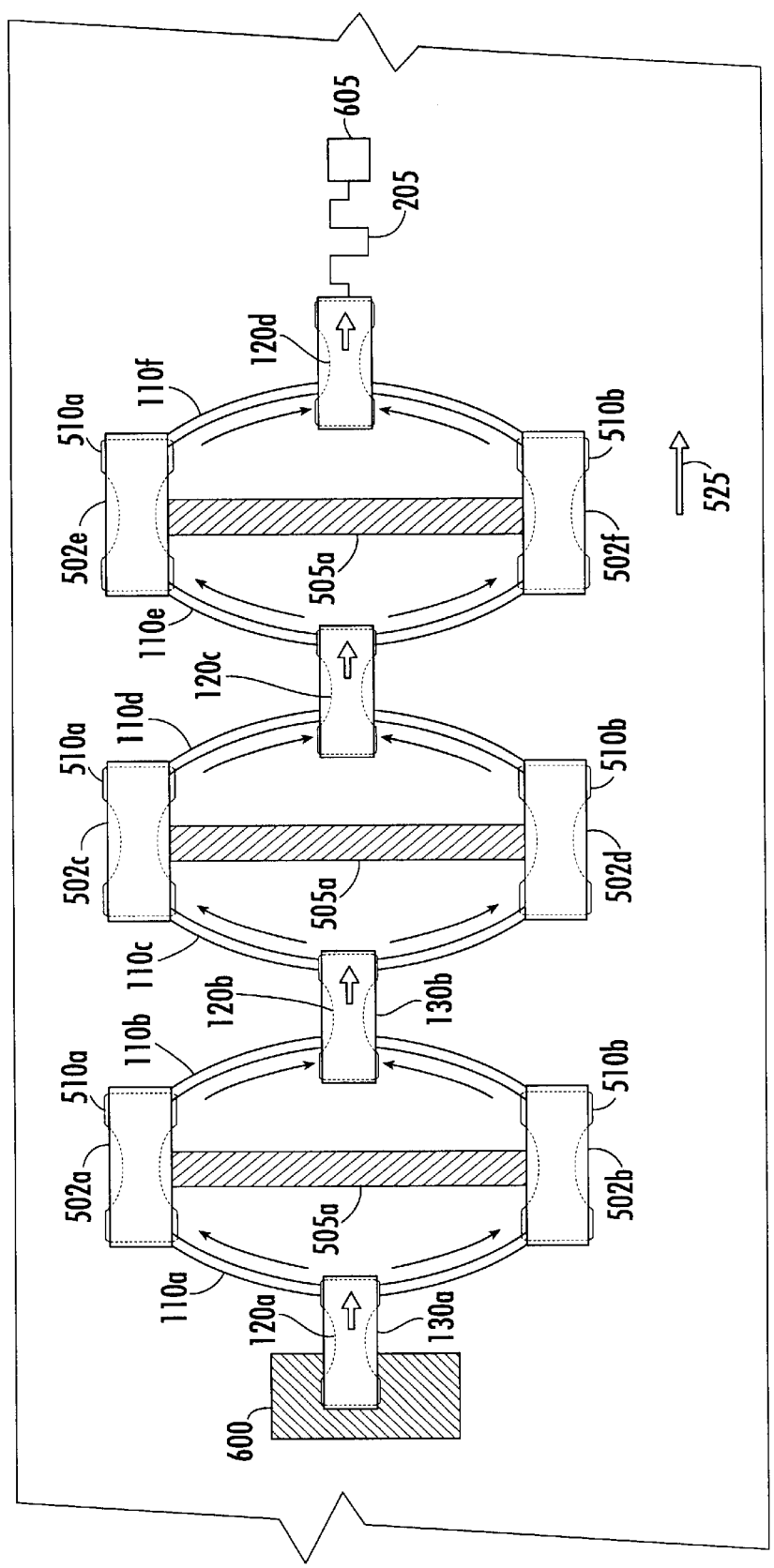
FIG. 6 is an enlarged plan view of a scalable unit cell array including three scaleable unit cells according to the present invention.

The current can be provided by applying a voltage between a first electrode electrically coupled to the first heater 120a and a tether electrically coupled to a final heater 120 thereby causing the arched beams to conduct the current to the respective heater thereon as shown for example in FIG. 6.

Scalable unit cells can be coupled together to form a scaleable unit cell array. Scaleable unit cell arrays can be used to increase the displacement of the thermally actuated microelectromechanical systems described herein. Scaleable unit cell arrays are further described, for example, in U.S. patent application Ser. No. 09/303,996 filed on May 3, 1999 entitled Multi-Dimensional Scalable Displacement Enabled Microelectromechanical Actuator Structures And Arrays the disclosure of which is incorporated herein by reference in its entirety.

Accordingly, one embodiment of the present invention provides a thermally actuated microelectromechanical array adapted to move along a one dimensional and/or two dimensional path of movement within a plane parallel to the plane defined by the microelectronic substrate. The thermally actuated microelectromechanical array may be formed by interconnecting at least two of any type of thermally actuated microelectromechanical structures described herein, preferably at least two of the same type of thermally actuated microelectromechanical structures. Since the thermally actuated microelectromechanical structures are scalable, relatively large amounts of displacement may be provided by configuring these structures in an array.

Each thermally actuated microelectromechanical unit cell comprises a pair of arched beams operably connected at opposite ends thereof as described previously. A first thermally actuated microelectromechanical cell is connected to at least one anchor, such as via a medial portion of one of the arched beams, and extends therefrom. The remainder of the thermally actuated microelectromechanical cells in the array are connected to one another such that each cell is operably connected to the first thermally actuated microelectromechanical cell. As such, the plurality of microelectromechanical cells extend from at least one anchor in a cantilever-like configuration overlying the microelectronic substrate, to provide the desired displacement.

FIG. 6 is an enlarged plan view of a scalable unit cell array including three scaleable unit cells according to the present invention. According to FIG. 6, a scaleable unit cell array includes the first-fourth heaters 120a–d electrically coupled in series with first-sixth arched beams 110a–f between an anchor 600 on the microelectronic substrate 100 and an electrode 605 on the microelectronic substrate 100. In another embodiment according to the present invention, the moveable spaced-apart supports 502 can be on respective heaters 510. The heaters 510 can provide additional heating to the arched beams.

In operation, current conducted by the first-fourth heaters 120a–d causes the first-sixth arched beams 110a–f to further arch so that the scalable unit cell array displaces in the first predetermined direction 525 relative to the anchor 600. Moreover, the heaters 120a–d move with the respective arched beams as they displace in response to the heat applied by the heaters 120a–d. A flexible tether 205 allows the fourth heater 120d to displace while remaining electrically coupled to the electrode 605.

According to the present invention, heaters are located on arched beams included in the thermally actuated microelectromechanical structures. Moreover, the heaters remain on the arched beams as they are displaced due to heating. Accordingly, the present invention may provide improved transient thermal response and improved thermal efficiency.

In particular, the heater is on the arched beam and moves therewith as the arched beam displaces. Heat can be applied directly to the arched beam, thereby reducing thermal loss due to a gap between the heater and the arched beam. Moreover, displacing the heater as the arched beam displaces may further reduce thermal loss by reducing the separation between the heater and the arched beam as the arched beam displaces.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed:

1. A microelectromechanical structure comprising:

a microelectronic substrate;

first and second spaced-apart supports on the microelectronic substrate;

an arched beam that extends between the first and second spaced-apart supports and that further arches upon application of heat thereto to thereby cause displacement of the arched beam;

a heater on the arched beam that applies heat to the arched beam and displaces with the arched beam as the arched beam displaces;

a second arched beam that extends between the first and second spaced-apart supports; and a coupler on the first and second arched beams, wherein the heater is on and displaces with the coupler.

2. The microelectromechanical structure of claim 1 further comprising:

a first contact on the coupler that electrically couples the first arched beam to the heater; and a second contact on the coupler that electrically couples the second arched beam to the heater to define an electrically conductive path from the first contact to the second contact through the heater.

3. The microelectromechanical structure of claim 2, wherein the coupler comprises spaced-apart first and second coupler portions.

4. The microelectromechanical structure of claim 3, wherein the first coupler portion is on the first arched beam and the second coupler portion is on the second arched beam.

5. The microelectromechanical structure of claim 3, wherein the first coupler portion is on the first and second arched beams and the second coupler is on the first and second arched beams.

6. The microelectromechanical structure of claim 2 further comprising:

a first anchor on and attached to the microelectronic substrate;

a second anchor on and attached to the microelectronic substrate;

a first flexible conductor that movably couples the first anchor to the first contact to define a second electrically conductive path between the first anchor and the first contact; and a second flexible conductor that movably couples the second anchor to the second contact to define a third electrically conductive path between the second anchor and the second contact.

7. A microelectromechanical structure comprising:

a microelectronic substrate;

a first pair of spaced-apart supports on the microelectronic substrate;

a first arched beam that extends between the first pair of spaced-apart supports and that expands upon application of heat thereto to thereby cause displacement of the first arched beam;

a second pair of spaced-apart supports on the microelectronic substrate;

a second arched beam that extends between the second pair of spaced-apart supports and that expands upon application of heat thereto to thereby cause displacement of the second arched beam;

a heater on the first and second arched beams that applies heat thereto and displaces therewith as the first and second arched beams displace;

a first coupler portion on the heater having an extension therefrom; and a second coupler portion on the heater having a recess therein, the second coupler portion spaced-apart from the first coupler portion so that the extension is positioned in the recess in a non-contacting relationship therewith.

8. The micro electromechanical structure of claim 7, wherein a first voltage level is applied to the first pair of spaced-apart supports and a second voltage level is applied to the second pair of spaced-apart supports.

9. The microelectromechanical structure of claim 7, wherein the arched beams comprise nickel and the heaters comprise polysilicon.

10. A microelectromechanical structure comprising:

a microelectronic substrate;

first and second spaced-apart supports on the microelectronic substrate;

a plurality of arched beams that extend between the first and second spaced-apart supports and that expand upon application of heat thereto to thereby cause displacement of the plurality of arched beams;

a heater on the plurality of arched beams that applies heat thereto and displaces with the plurality of arched beams as the plurality of arched beams displace;

a first coupler portion on the heater having a plurality of extensions therefrom; and a second coupler portion on the heater having a plurality of recesses therein, the second coupler portion spaced-apart from the first coupler portion so that the plurality of extensions are positioned in the plurality of recesses in a non-contacting relationship therewith.

11. The microelectromechanical structure of claim 10, wherein a first voltage level is applied to the first support and a second voltage level is applied to the second support.

12. The microelectromechanical structure of claim 10, wherein the arched beams comprise nickel and the heaters comprise polysilicon.

13. A microelectromechanical structure comprising:

a microelectronic substrate;

an anchor connected to the microelectronic substrate;

a pair of spaced-apart movable supports on the microelectronic substrate;

a cross-beam that extends between the pair of spaced-apart moveable supports;

a first arched beam arched in a first predetermined direction that extends between the pair of spaced-apart movable supports and that expands upon application of heat thereto to thereby cause displacement of the first arched beam in the first predetermined direction relative to the pair of spaced-apart movable supports;

a first heater on the first arched beam and connected to the anchor, that applies heat to the anchor and displaces with the first arched beam as the first arched beam displaces; and a second arched beam arched in a second predetermined direction that extends between the pair of spaced-apart movable supports and that expands upon application of heat thereto to thereby cause displacement of the second arched beam in the second predetermined direction relative to the pair of spaced-apart movable supports.

14. The microelectromechanical structure of claim 13 further comprising:

a second heater on the second arched beam that applies heat thereto and displaces with the second arched beam as the second arched beam displaces.

15. The microelectromechanical structure of claim 14, wherein the microelectromechanical structure comprises a unit cell, the microelectromechanical structure further comprising:

a second unit cell adjacent to the first unit cell, including:

a second pair of spaced-apart movable supports on the microelectronic substrate;

a third arched beam arched in the first predetermined direction that extends between the second pair of spaced-apart movable supports and that expands upon application of heat thereto to thereby cause displacement of the third arched beam in the first predetermined direction relative to the second pair of spaced-apart movable supports, wherein the second heater is on the third arched beam.

16. The microelectromechanical structure of claim 15 further comprising:

a coupler on the second heater.

17. The microelectromechanical structure of claim 13 further comprising:

a coupler on the first heater.

* * * * *